(12) United States Patent
Haza et al.

(10) Patent No.: US 7,105,933 B2
(45) Date of Patent: Sep. 12, 2006

(54) SEMICONDUCTOR INTEGRATED CIRCUIT DEVICE AND MANUFACTURING METHOD OF THE SAME

(75) Inventors: Akinori Haza, Osaka (JP); Yasuyuki Okada, Osaka (JP); Masumi Nobata, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/809,796

(22) Filed: Mar. 26, 2004

(65) Prior Publication Data

US 2004/0245656 A1    Dec. 9, 2004

(30) Foreign Application Priority Data

Mar. 28, 2003  (JP)  .......................... P. 2003-091915

(51) Int. Cl.
*H01L 23/48*   (2006.01)
*H01L 23/52*   (2006.01)
*H01L 29/40*   (2006.01)

(52) U.S. Cl. .................. 257/786; 257/773; 257/48; 257/737; 257/778

(58) Field of Classification Search ................ 257/786, 257/773, 48, 737; 438/601
See application file for complete search history.

(56) References Cited

U.S. PATENT DOCUMENTS

| 5,444,012 | A | * | 8/1995 | Yoshizumi et al. ............ 438/6 |
| 5,898,186 | A | | 4/1999 | Farnworth et al. |
| 6,228,684 | B1 | * | 5/2001 | Maruyama .................. 438/113 |
| 6,621,260 | B1 | | 9/2003 | Eldridge et al. |
| 6,838,367 | B1 | * | 1/2005 | Rhodes ....................... 438/601 |
| 2003/0032263 | A1 | | 2/2003 | Nagao et al. |

FOREIGN PATENT DOCUMENTS

| CN | 1405867 A | 3/2003 |
| JP | 10-284611 | 10/1998 |

* cited by examiner

*Primary Examiner*—Nitin Parekh
(74) *Attorney, Agent, or Firm*—McDermott Will & Emery LLP

(57) ABSTRACT

To provide a semiconductor device which can be downsized and integrated to a high degree.

A semiconductor device including a rewiring mixedly includes an input/output (I/O) cell connected to a probing pad; and another input/output (I/O) cell having no probing pad.

7 Claims, 9 Drawing Sheets

SEMICONDUCTOR INTEGRATED CIRCUIT DEVICE AND MANUFACTURING METHOD OF THE SAME

BACKGOURND OF THE INVENTION

1. Field of the Invention

This invention relates to a semiconductor integrated circuit, and more particularly to the configuration of an input/output circuit cell.

2. Description of the Related Art

Generally, a flip-chip LSI has the following arrangement. Probing pads are arranged on the periphery of a chip. LSI peripheral circuit elements are arranged at a certain pitch in an area inside the probing pads. The LSI peripheral circuit elements include an input/output circuit cell, a power supply cell for an input/output circuit for supplying a power supply voltage to the input/output circuit, and another power supply cell for an LSI internal logic circuit for supplying a power supply voltage to the LSI internal logic circuit. A cell region for the LSI internal logic circuit and others is arranged inside the LSI peripheral circuit elements.

Further, on the surface of the chip, rearrangement wirings 5 for connecting the terminal pads and the LSI are arranged. The power supply lines for supplying a power supply voltage to drive these circuit elements include a power supply line for the LSI peripheral circuit located above the LSI peripheral circuit elements and another power supply line for the LSI internal logic circuit arranged on the periphery of the LSI internal logic circuit. These power supply lines are electrically isolated from one another. Incidentally, a flip-chip package may be e.g. a package including a ball grid array (BGA) formed on a stiffener.

The timings of supplying a power supply voltage to each of the circuit elements within the LSI chip include a product testing timing as well as an operating timing. The product test includes a probing test at a wafer step and a test at a step of finished products after assembled. In the case of the test at a step of finished products after assembled, the product is operated at actual using frequency to test the input/output timing of a signal. In this case, for the purpose of evaluating the performance of the LSI chip in terms of its function and characteristic, both the LSI peripheral circuit element and the LSI internal logic circuit must be supplied with a sufficient power supply voltage.

In recent years, with the development of large-scaling of LSI, the degree of integration continues to increase. The number of input terminals also continues to increase. However, as regards the probing pads 2, the pad pitch is limited to about 120 μm under the present conditions in view of the operability of probing test or bonding. This is one problem which obstructs high degree of integration.

This problem can be solved by a "staggered arrangement" in which a plurality of input/output circuits 3 are arranged at a pitch lager than half the pad pitch permitting bonding and a plurality of probing pads 2 are arranged at a pitch larger than the pad pitch permitting bonding on the region on the side of the chip periphery and on the cell region 6 on the side of the chip center with respect to the plurality of input/output circuits, respectively.

(JP-A-10-284611)

However, the staggered arrangement requires a wider pad region than a "single row arrangement" and is structured so that an internal circuit is separated from the pad region, which provides an empty region. This led to a limitation in the reduction of the chip size.

As described above, the conventional semiconductor device is under the restriction in the arrangement of the probing pads. This has been a great problem which obstructs the high degree of integration.

Further, if the bit width of data is increased in order to perform the high speed data transfer, the number of input/output circuit cells is increased. This led to the problem of increasing the number of the power supply cells for the input/output circuits to supply the power to these input/output cells.

SUMMARY OF THE INVENTION

This invention has been accomplished under the circumstance described above. An object of this invention is to provide a semiconductor device which can be downsized and integrated to a high degree, and provides good and sure operability of probing test.

In order to attain the above object, this invention provides a semiconductor device including a rewiring characterized by mixedly comprising: an input/output (I/O) cell connected to a probing pad; and another input/output (I/O) cell having no probing pad.

Some input/output cells do not necessarily require the probing pad. Therefore, these input/output cells are not provided with the probing pad. For this reason, the pitch of arranging the cells can be increased by the extent of the input/output cells provided with no probing pad. Thus, the degree of integration can be improved without reducing packaging operability.

Further, the semiconductor device is characterized by further comprising a DRAM.

In the case of the DRAM, if it is found by the test using the probing pad that the characteristic is problematic, the memory array which is problematic in the characteristic is cut by breaking fuse and others, and connected to a spare redundant circuit so that it is relieved.

The semiconductor device is characterized by further comprising a fuse element. If it is found by the test using the probing pad that the characteristic is problematic, redundancy relief and characteristic adjustment (trimming) can be easily carried out by breaking the fuse element.

The semiconductor device may lack a probing pad on at least one side. If the input/output circuit(s) provided with no probing pad is arranged on this side, the entire area on this side where the probing pad is formed can be reduced.

Further, in the semiconductor device according to this invention, the probing pads may be arranged in a staggered manner.

The input/output circuit cells are connected to the probing pads for probing test and connected to the terminal pads for external connection. In the test, from the probing pads, the monitoring of inputting or outputting a test pattern and power supply are carried out so that one of circuit blocks is subjected to probing test . . . . In the testing at the stage of the final product after assembled, a signal and power are supplied from the package pins (terminals) connected to the terminal pads to drive the other of the circuit blocks.

Thus, in a probing test, a semiconductor device with a small IR drop can be provided without increasing the chip area.

The plurality of circuit blocks include an internal logic circuit block of a semiconductor integrated circuit and an input/output circuit block on the periphery. These circuit blocks are connected to the probing pads for probing test and terminal pads for external connection through the above input/output circuit cells. In the testing, from the probing pads, the monitoring of inputting or outputting a test pattern and power supply are carried out so that one of the circuit blocks is subjected to probing test. In driving, a signal and power are supplied from the package connected to the terminal pads to drive the internal logic circuit block.

The probing pads are arranged on the surface of the semiconductor integrated chip. The terminal pads are preferably connected to the internal logic circuit block connected to the input/output circuit cells through contacts formed in an insulating film overlying the probing pads.

The probing pads are preferably arranged on the surface of the edge of the semiconductor integrated circuit chip. This permits the chip area to be employed effectively.

The semiconductor integrated circuit device is preferably an flip-chip LSI provided with a rearrangement wiring on the surface and connected to a packaging substrate by face-down bonding.

DESCRPITION OF THE PREFERRD EMBODIMENTS

Figure 1:
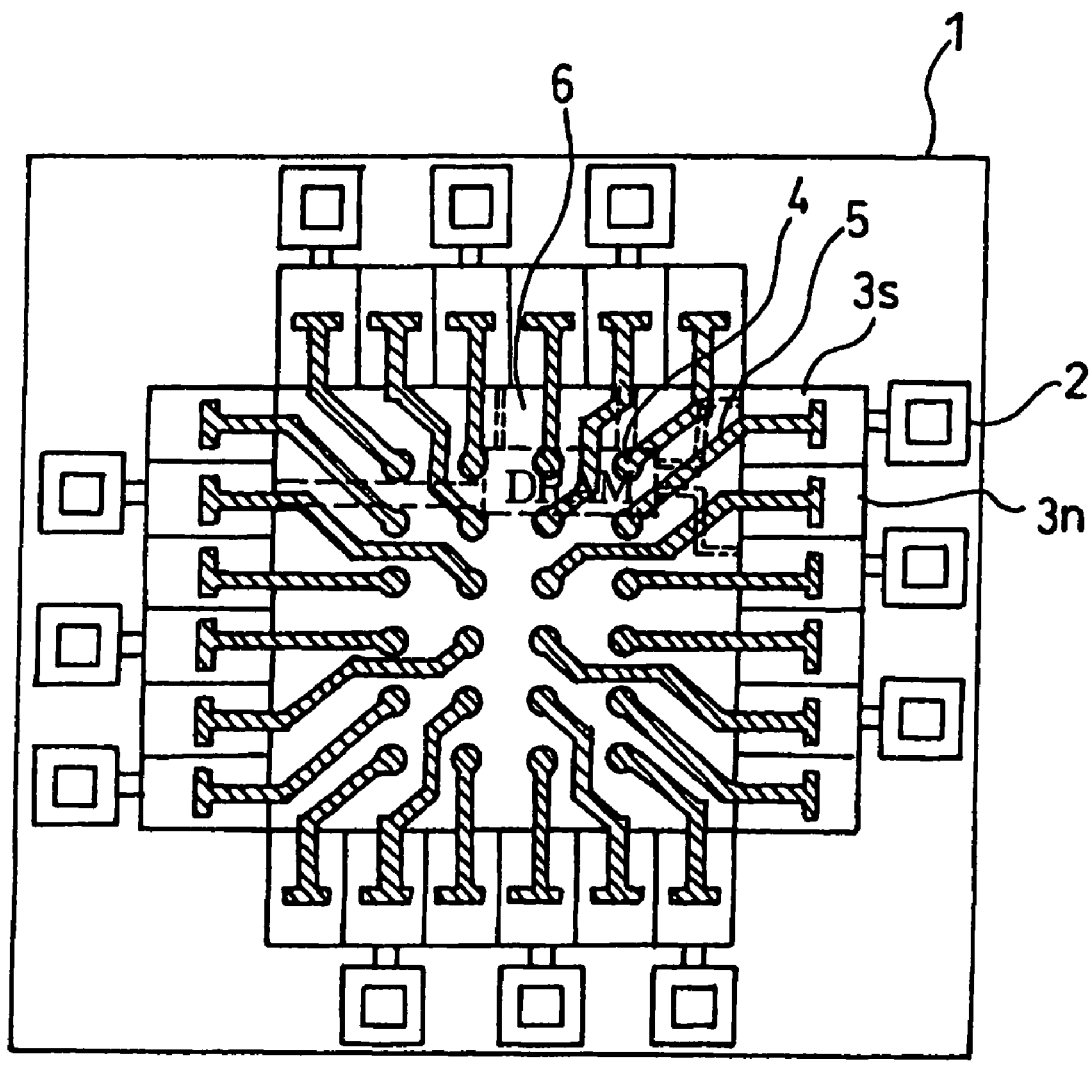
FIG. 1 is a plan view for explaining an LSI according to the first embodiment of this invention.

Now referring to the drawings, an explanation will be given of an embodiment of this invention. First, the arrangement of the cells and their operation will be explained.

Embodiment 1

Figure 5:
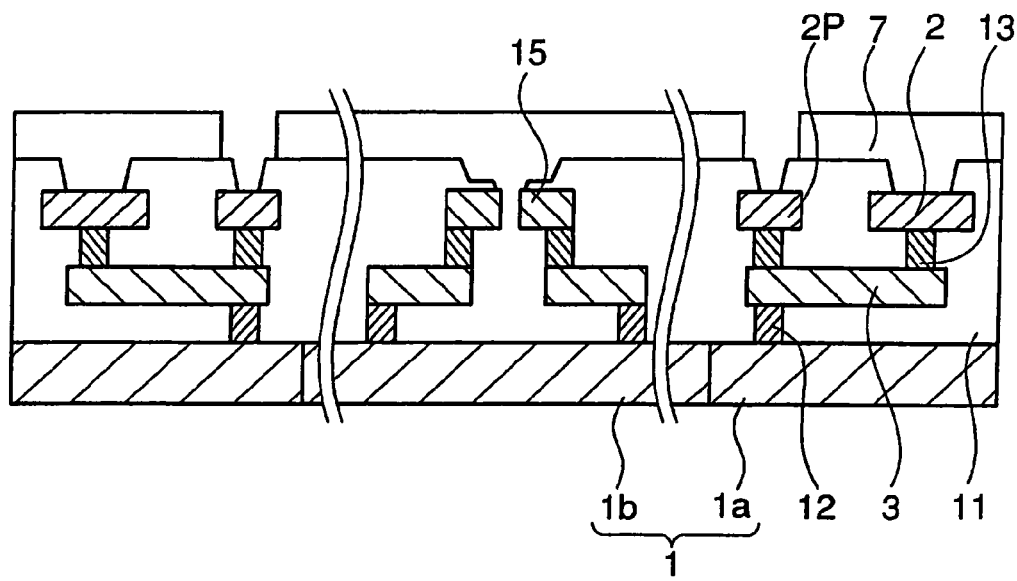
FIG. 5 is a manufacturing flowchart of the LSI according to the first embodiment of this invention.
Figure 6:
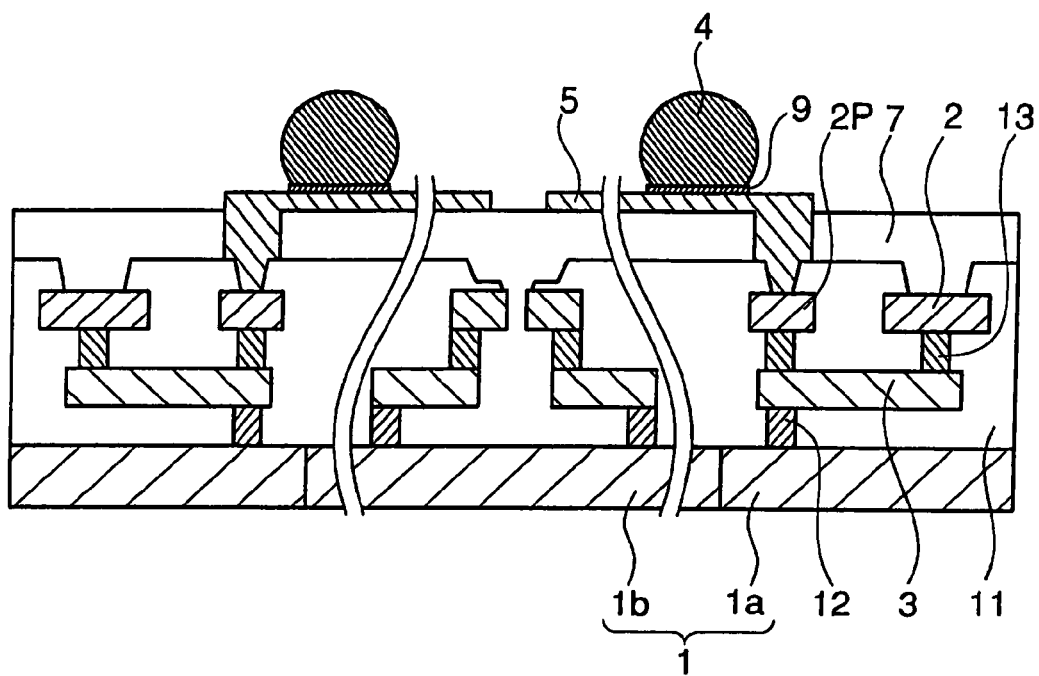
FIG. 6 is a manufacturing flowchart of the LSI according to the first embodiment of this invention.

An LSI chip 1 according to this invention, as seen from FIG. 1 which is a schematic view thereof and FIG. 5 which is a sectional view of the main part, includes probing pads 2 on the outer periphery of the chip; first input/output circuits 3S connected to the probing pads, respectively, inside them; second input/output circuit cells 3n connected between these input/output cells and provided with no probing pad; rearrangement wirings 5 layered on these first and second input/output cells; and terminal pads formed on the rearrangement wirings and an element region 6.

It should be noted that the element region constitutes a DRAM.

An explanation will be given of a manufacturing process of the LSI chip 1.

Figure 2:
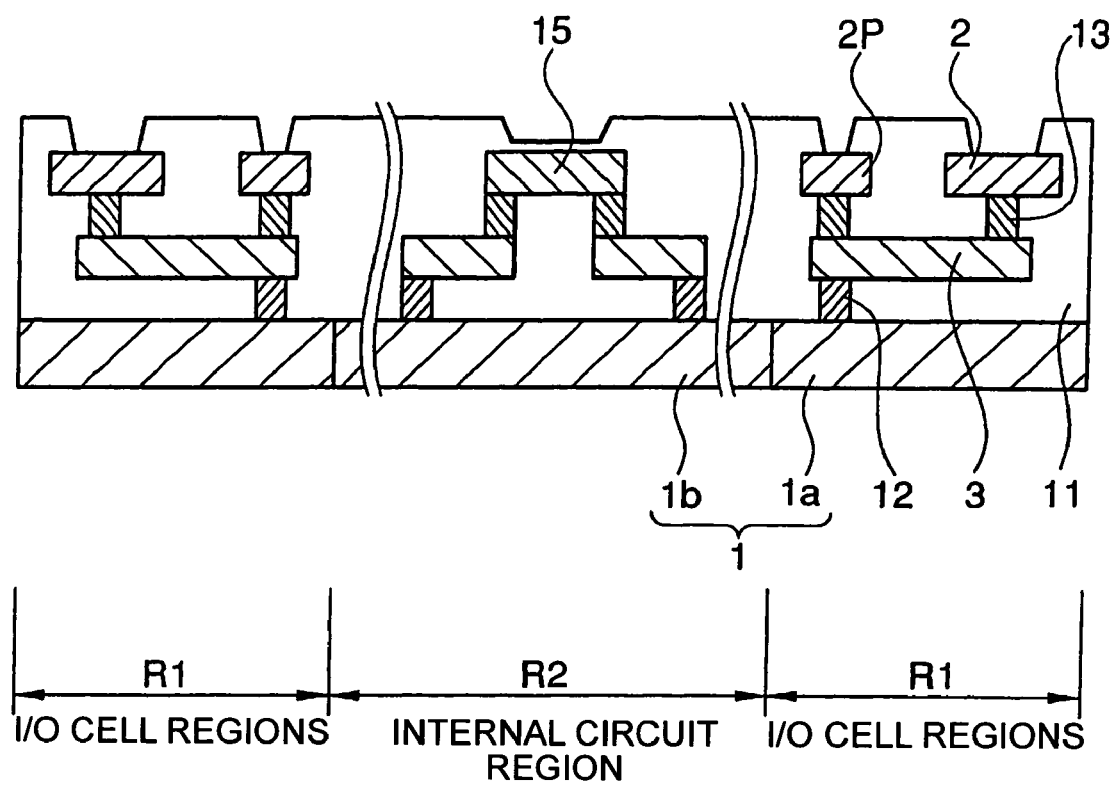
FIG. 2 is a manufacturing flowchart of the LSI according to the first embodiment of this invention.

First, as seen from FIG. 2, input/output cells and power supply cells 1a are formed in the I/O cell regions in the surface of a silicon substrate 1, and DRAMs 1b are formed on an element region (internal circuit region R2). A first layer aluminum wiring is formed for these DRAMs so as to be brought into contact with contacts 12 formed in an interlayer insulating film 11. A second layer aluminum wiring is formed through contacts 13 so as to constitute probing pads 2 and rearrangement wiring pads 2P. The regions among wiring patterns and among wiring layers are covered with an interlayer insulating film.

Figure 3:
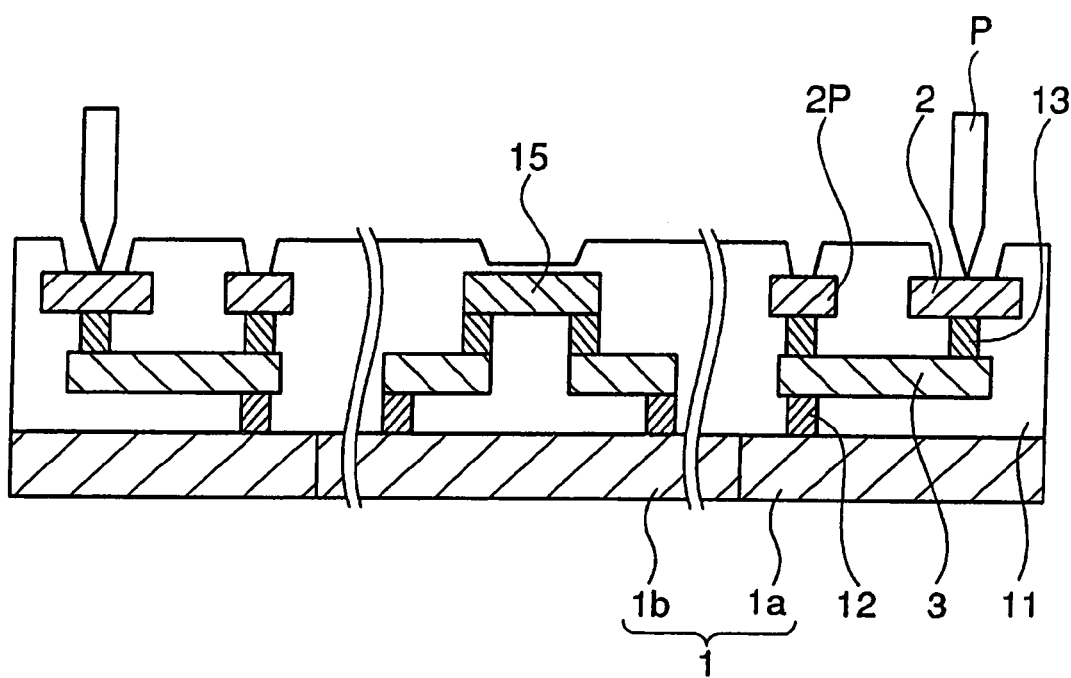
FIG. 3 is a manufacturing flowchart of the LSI according to the first embodiment of this invention.

As seen from FIG. 3, contact holes are formed in the interlayer insulating layer to expose the probing pads 2. Using the probes, a probing test is carried out.

Figure 4:
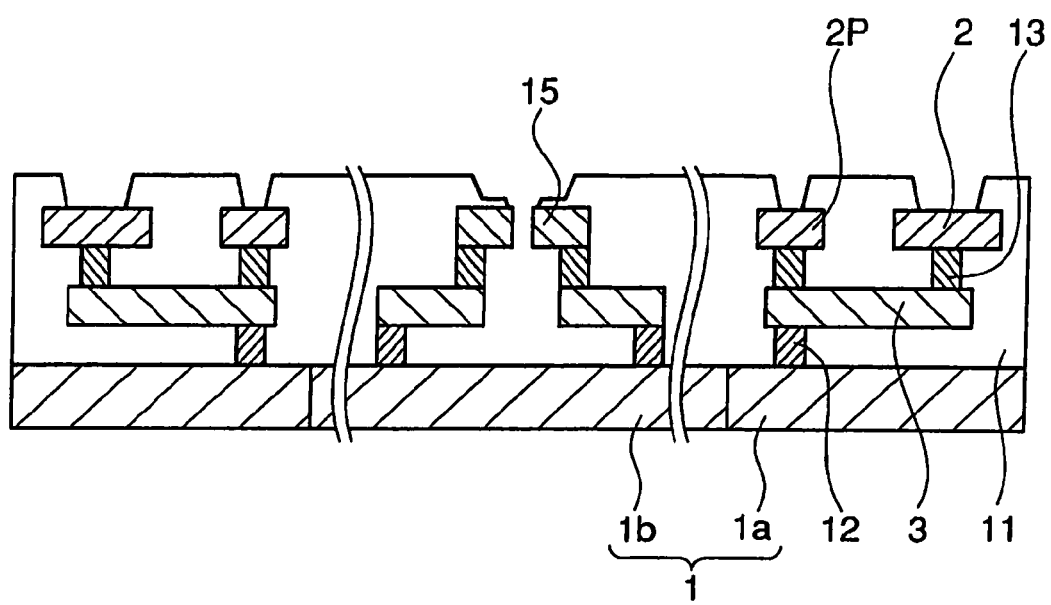
FIG. 4 is a manufacturing flowchart of the LSI according to the first embodiment of this invention.

If the probing test determines that the DRAM characteristic is problematic, a fuse layer is cut as shown in FIG. 4.

Further, as seen from FIG. 5, an insulating protective film 21 is applied to protect the surface.

Finally, contacts are made on the insulating film 21 to form rearrangement wirings 5. Solder bumps 4 are formed through barrier metals 9.

In accordance with such a configuration, only the input/output circuits 3S which require the probing pads are provided with probing pads, whereas the other input/output circuit are not provided with no probing pad. For this reason, in the semiconductor device according to this invention, the element area can be reduced without reducing the performance.

Embodiment 2

Figure 7:
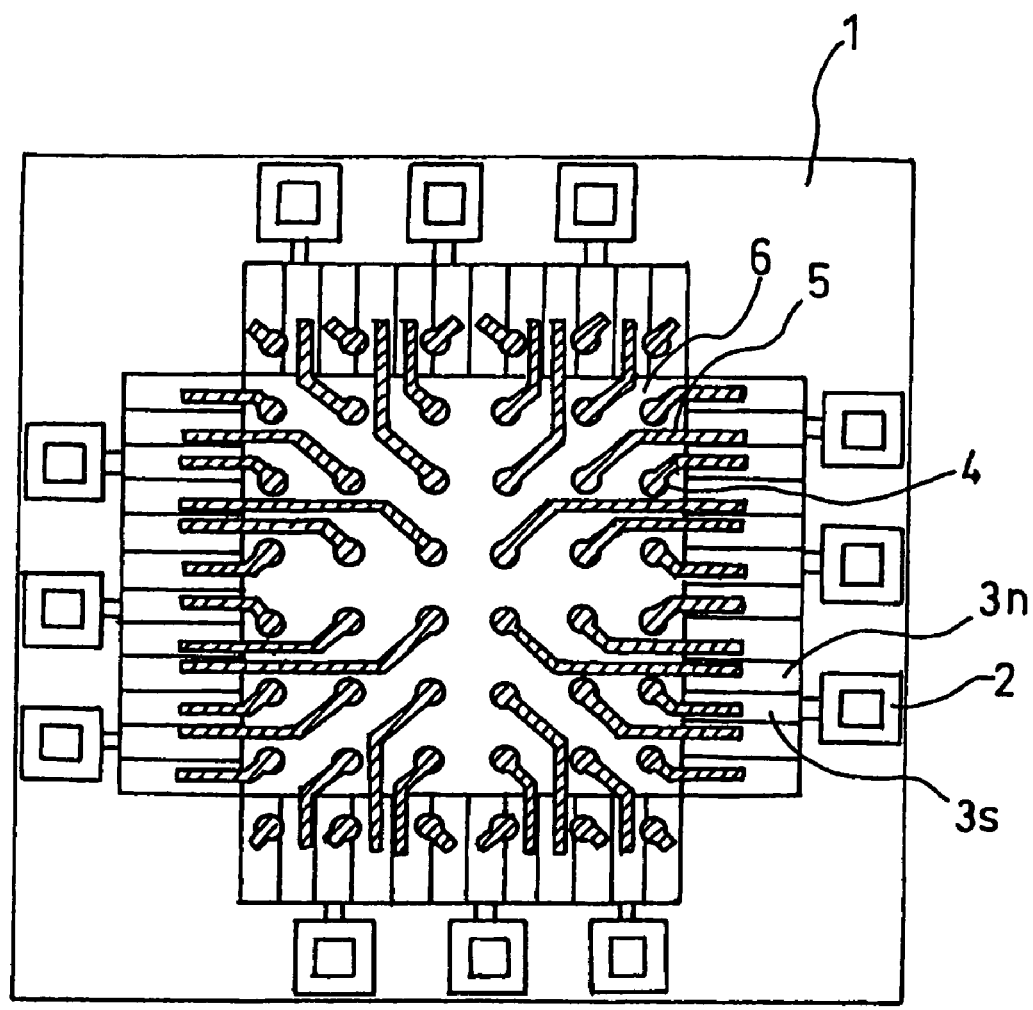
FIG. 7 is a manufacturing flowchart of the LSI according to the second embodiment of this invention.

Incidentally, in the previous embodiment, the probing pad 2 was formed for every other input/output circuit. In this second embodiment, as seen from FIG. 7, one probing pad 2 is connected for four input/output circuits.

In this configuration, the width of the input/output cell is reduced to half in that in the first embodiment. Thus, the number of bumps is increased so that the number of terminals usable in the test after sealing can be increased, thereby realizing "high speed multi-pin".

Embodiment 3

Figure 8:
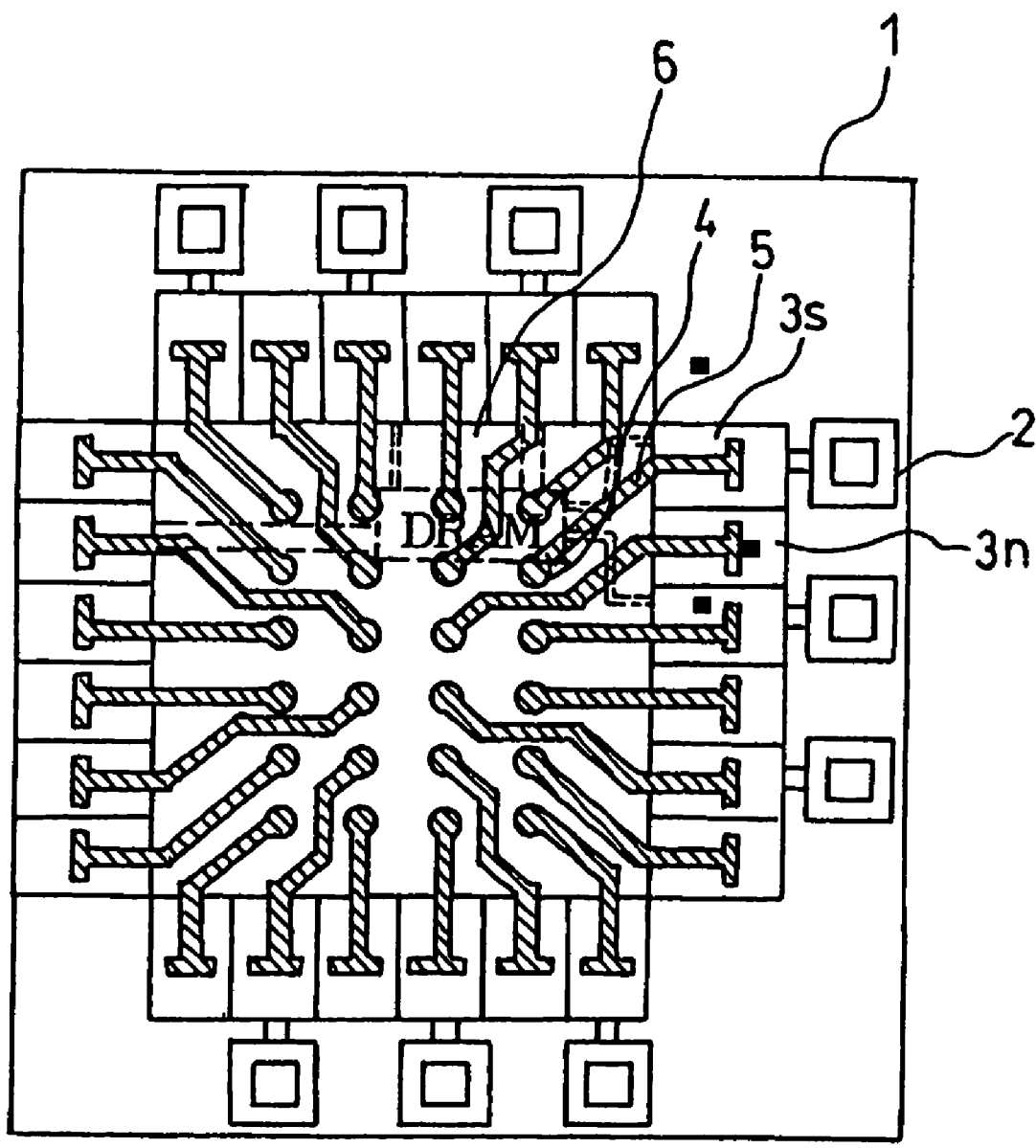
FIG. 8 is a manufacturing flowchart of the LSI according to the third embodiment of this invention.
Figure 9:
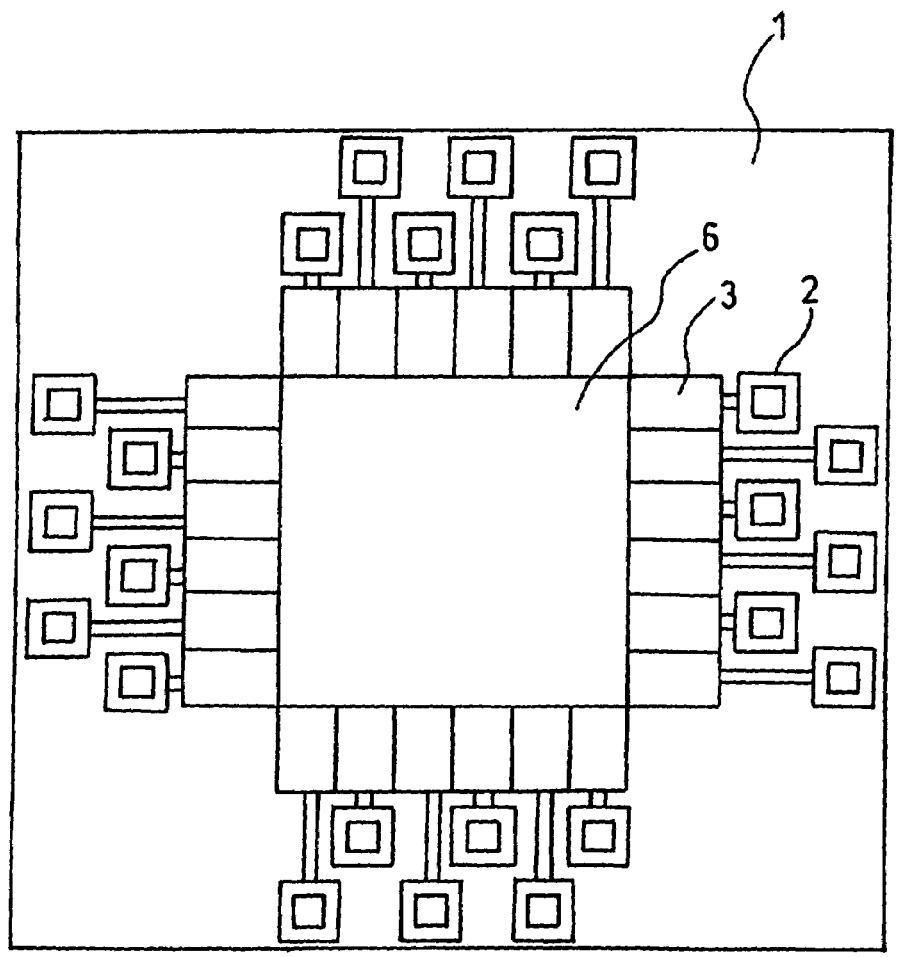
FIG. 9 is a schematic view of a flip-chip LSI according to a prior art.

In the first embodiment, the probing pad 2 was formed for every other input/output circuit in each of four sides. On the other hand, in this third embodiment, as seen from FIG. 8, in three sides of the four sides, the probing pad 2 is formed for every other input/output circuit, whereas in the remaining one side, no probing is formed. In accordance with this embodiment, the cell area can be greatly reduced.

In accordance with this invention, a down-sized LSI can be formed without deteriorating its performance.

What is claimed is:

1. A semiconductor integrated circuit device comprising:
   a silicon substrate;
   a plurality of internal circuits each formed on an element region of the silicon substrate;
   a first input/output (I/O) cell formed on an I/O cell region of the silicon substrate, the first I/O cell including a first I/O circuit, a first electrode portion horizontally spaced apart from the first I/O circuit with respect to the silicon substrate and a second electrode portion formed on the first I/O circuit, the first electrode portion and the second electrode portion electrically connected to each other and electrically connected to a first internal circuit of the plurality of internal circuits;
   a second I/O cell formed on the I/O cell region of the silicon substrate, the second I/O cell including a second I/O circuit and a third electrode portion formed on the second I/O circuit, the third electrode portion electrically connected to a second internal circuit of the plurality of internal circuits; and an interlayer insulating film formed on the plurality of internal circuits, the first I/O cell and the second I/O cell and exposing the first electrode portion as a probing pad, the second electrode portion as a first terminal pad and the third electrode portion as a second terminal pad.

2. The semiconductor integrated circuit device according to claim 1, wherein an area of each of the first terminal pad and the second terminal pad is smaller than that of the probing pad.

3. The semiconductor integrated circuit device according to claim 1, wherein the first internal circuit is a DRAM including a fuse element electrically connected to the probing pad.

4. The semiconductor integrated circuit device according to claim 1, further comprising a plurality of I/O cells each formed on the I/O cell region of the silicon substrate and placed along one side of the silicon substrate, and
wherein each of the plurality of I/O cells includes an I/O circuit and an electrode portion formed on a corresponding one of the I/O circuits, the electrode portion electrically connected to a corresponding internal circuit of the plurality of internal circuits.

5. A semiconductor integrated circuit device comprising:
a silicon substrate;
a plurality of internal circuits each formed on an element region of the silicon substrate;
a first input/output (I/O) cell formed on an I/O cell region of the silicon substrate, the first I/O cell including a first I/O circuit a first electrode portion horizontally spaced apart from the first I/O circuit with respect to the silicon substrate and a second electrode portion formed on the first I/O circuit, the first electrode portion and the second electrode portion electrically connected to each other and electrically connected to a first internal circuit of the plurality of internal circuits;
a second I/O cell formed on the I/O cell region of the silicon substrate the second I/O cell including a second I/O circuit and a third electrode portion formed on the second I/O circuit, the third electrode portion electrically connected to a second internal circuit of the plurality of internal circuits;
an interlayer insulating film formed on the plurality of internal circuits the first I/O cell and the second I/O cell and exposing the first electrode portion as a probing pad, the second electrode portion as a first terminal pad and the third electrode portion as a second terminal pad;
an insulating protective film formed on a surface of the interlayer insulating film, the insulating protective film covering the probing pad from above with respect to the silicon substrate and exposing the first terminal pad and the second terminal pad;
a first rearrangement wiring formed on a surface of the insulating protective film and electrically connected to the first terminal pad;
a second rearrangement wiring formed on a surface of the insulating protective film and electrically connected to the second terminal pad;
a first solder bump formed on the first rearrangement wiring; and
a second solder bump formed on the second rearrangement wiring.

6. The semiconductor integrated circuit device according to claim 5, further comprising a first barrier metal layer formed between the first solder bump and a surface of the first rearrangement wiring and a second barrier metal layer formed between the second solder bump and a surface of the second rearrangement wiring.

7. The semiconductor integrated circuit device according to claim 5, further comprising a plurality of I/O cells each formed on the I/O cell region of the silicon substrate and placed along one side of the silicon substrate, and
wherein each of the plurality of I/O cells includes an I/O circuit and an electrode portion formed on a corresponding one of the I/O circuits, the electrode portion electrically connected to a corresponding internal circuit of the plurality of internal circuits.

* * * * *